United States Patent [19]

Falckenberg et al.

[11] Patent Number: 4,563,979
[45] Date of Patent: Jan. 14, 1986

[54] APPARATUS FOR MANUFACTURING LARGE-SURFACE, BAND-SHAPED SILICON FOR SOLAR CELLS

[75] Inventors: Richard Falckenberg, Wald; Josef Grabmaier, Berg, both of Fed. Rep. of Germany

[73] Assignee: Siemens Aktiengesellschaft, Berlin and Munich, Fed. Rep. of Germany

[21] Appl. No.: 560,047

[22] Filed: Dec. 9, 1983

[30] Foreign Application Priority Data

Feb. 24, 1983 [DE] Fed. Rep. of Germany ....... 3306515

[51] Int. Cl.⁴ ................................................ B05C 3/15
[52] U.S. Cl. .................................... 118/694; 118/401;
118/419; 118/DIG. 2; 156/617 H; 156/622;
156/DIG. 83; 156/DIG. 88; 156/DIG. 97;
422/247; 422/249
[58] Field of Search ................ 422/247, 249; 156/605,
156/607, 617 SP, DIG. 83, DIG. 88, DIG. 97,
DIG. 98, 617 H, 622; 118/718, 720, 729, 401,
409, 402, 405, 412, 420, 423, DIG. 2, 694

[56] References Cited

U.S. PATENT DOCUMENTS

| | | | |
|---|---|---|---|
| 2,928,212 | 3/1960 | Long | 156/DIG. 97 |
| 3,607,115 | 9/1971 | Bleil | 422/249 |
| 3,759,671 | 9/1973 | Bleil | 422/249 |
| 4,264,407 | 4/1981 | Shudo et al. | 156/617 SP |
| 4,305,776 | 12/1981 | Grabmaier | 156/607 |
| 4,319,195 | 5/1982 | Kudo | 156/617 SP |
| 4,478,880 | 10/1984 | Belouet | 156/DIG. 88 |

Primary Examiner—David L. Lacey
Attorney, Agent, or Firm—John Francis Moran

[57] ABSTRACT

Apparatus for the manufacture of large-surfaced, band-shaped silicon bodies for solar cells through a continuous layering process which uses a net-like structured graphite carrier unit. The net-like structure is used in conjunction with a melting pot made from graphite for receiving silicon smelt. The smelt is fed via a drain opening provided in the floor section of the melting pot to the carrier unit guided through a canal which has been arranged in horizontal direction below the melting pot. In order to ensure a continuous replacement of the smelt volume in the layering canal, the canal is shaped in downward direction as a shallow basin made from quartz, whereby the basin areas "a" and "b" are of different depth. In this manner, a "reserve volume" is provided, which ensures a uniform layering. The apparatus allows a continuous production of silicon bands for solar cells.

12 Claims, 4 Drawing Figures

APPARATUS FOR MANUFACTURING LARGE-SURFACE, BAND-SHAPED SILICON FOR SOLAR CELLS

BACKGROUND OF THE INVENTION

The present invention relates to an apparatus for manufacturing large-surface, band-shaped silicon for solar cells. The manufacturing process of silicon for solar cells includes the continuous layering of a net-like structured graphite carrier, which, although resistant to silicon smelt, can be wetted by the smelt. The arrangement furthermore includes:

(a) a melting pot for receiving the silicon smelt, whereby the floor of the melting pot has been provided with a vertical, and out-ward extending drain opening for forwarding the smelt to the carrier unit; and (b) a horizontally arranged, heatable canal located below the melting pot in the area of the drain opening to guide the carrier unit.

It is recommended that reasonably priced silicon be used for the manufacture of solar cells. The requirements with respect to crystal quality are not as stringent as those for semi-conductor components applied in conjunction with integrated circuits. Therefore, efforts were made to find the means to manufacture silicon crystals in the simplest and most cost effective manner, that is to say, without material waste.

A method for manufacturing cheap silicon is known through German patent document DE-OS No. 28 50 805. With this method silicon sheets for solar cells can be produced at a high output rate (approx. 1 m$^2$/min.) by moving a carrier unit, consisting of graphite and provided with holes, during an extraction procedure in a slightly curved mode across the surface of the silicon smelt, whereby the carrier unit is integrated in the silicon body formed by the crystalization of the silicon.

In this case the convection currents present in the smelt pose technical difficulties, since these currents lead to considerable temperature fluctuations at the crystalization front and consequently affect the thickness of the plane-shaped silicon body. It is also difficult to feed the silicon smelt continuously and consistently to maintain an unchanging smelting level, which is considered a necessary prerequisite for the uniform layering of the carrier unit.

An additional improvement with respect to the crystal quality and the uniformity of the layering process is achieved by the kind of configuration mentioned in the introduction, which has been already proposed in the German patent application No. 32 31 326.8. As can be seen in FIG. 1 of this application, a net-like carrier unit is inserted in a horizontally arranged canal extending below a melting pot provided with drain openings. Subsequently the net-like carrier unit is brought into contact with the silicon smelt to be followed by the crystalization of the silicon in the loops of the net. In accordance with this layering configuration, the maximum loop size to be filled is limited to 5×5 mm$^2$ and does not guarantee uniform layering procedures, because this configuration does not provide the proper control to regulate the flow of silicon into the layering canal or in the melting pot. It has been established, that the silicon smelt present in the canal might spill over as soon the smelt has exceeded a certain critical volume.

SUMMARY OF THE INVENTION

It is the object of this invention to improve the already mentioned configuration, so that a uniform layering of a carrier body comprised of graphite mesh (nets) is ensured by eliminating the flow problem of the silicon smelt through the use of a reserve smelt of variable volume.

This problem is solved according to the invention by a configuration, which in addition to the characteristics (a) and (b) listed above is characterized in that:

(c) A canal for receiving the reserve smelt, which extends downward in the shape of a flat basin, is provided;

(d) the floor of the melting pot consists of a material which can be easily wetted by the silicon smelt; and (e) the basin for the reserve smelt is comprised of a material that cannot be wetted by the silicon smelt and includes two areas of different basin depths a and b, whereby the distance basin floor/melting pot floor of the area a located in the direction of the layered carrier unit is larger by at least a factor of 2 than the distance basin floor/melting pot floor of area b located in the direction of the non-layered carrier unit.

By using the approach of moving the carrier unit through a silicon smelt reservoir in which a silicon meniscus is maintained at the point at which the carrier unit leaves the reservoir uniform layering is ensured. This holds true, although the silicon volume in the reservoir might fluctuate by as much as 15%.

Other features and advantages of the invention will be apparent from the following description of the preferred embodiments, and from the claims.

For a full understanding of the present invention, reference should now be made to the following detailed description of the preferred embodiments of the invention and to the accompanying drawings.

DETAILED DESCRIPTION

Figure 1:
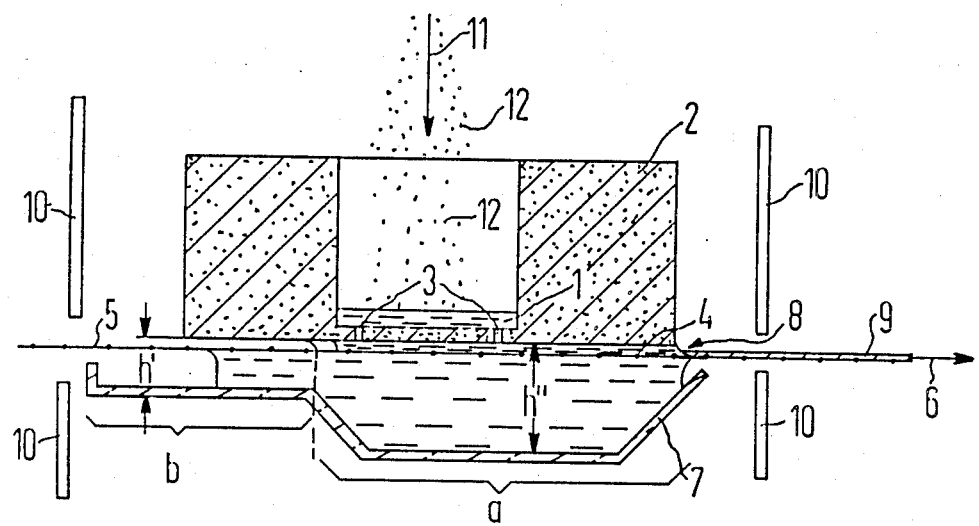
FIG. 1 shows an apparatus in accordance with a preferred embodiment of the invention.

Referring to FIG. 1. there is shown a floor section of melting pot 2 manufactured from graphite and filled with silicon smelt 1. Drain openings 3 have been provided through which the silicon smelt 1 reaches a canal 4. Through canal 4 a carrier unit 5 consisting of a graphite net with loops measuring 10×10 mm$^2$ is moved in horizontal direction (see arrow 6) and layered with silicon smelt 1. Canal 4 is limited in upward movement by the floor section of melting pot 2 (well wetted by the silicon), while in the downward direction canal 4 is limited by basin 7 manufactured from quartz (poorly wetted by the silicon). The canal 4 is defined as the intermediate region between the bottom of melting pot 2 and the upper surface of silicon smelt 1 in basin 7. The basin 7 shows two different basin depths a and b. The basin area facing the layered carrier unit 9 has been identified with a, the basin area facing the non-layered carrier unit which actually is the graphite net 5 is identified as b. The quartz basin 7 has been provided with a level floor in basin area b. Its distance h' to the melting pot floor (2) is smaller by at least a factor of 2 than distance h" measured from the floor of basin area a of the quartz basin 7. When forwarding silicon smelt 1 from the graphite melting pot 2 to quartz basin 7, basin area a will be filled first. The smelt will rise until it contacts the floor of graphite melting pot 2, without filling basin area b of basin 7. A meniscus begins to form at the exit point of the graphite net 5 (see arrow 8), which ends in upward direction at the leading edge of graphite smelting pot 2 and in downward direction at the inner wall of quartz basin 7. If the smelt volume decreases in basin area a, the silicon smelt detaches itself from the graphite floor (2) and the wetting procedure of the graphite net 5 is interrupted. However, if the smelt is refilled in a manner, which ensures that a part of basin area b is constantly filled, the danger of interruption is eliminated due to the presence of a "reserve volume." Under these conditions, the graphite net 5 will be uniformly wetted, carrier unit 9 will be formed and the graphite net 5 integrated therein. The heating configuration has been identified with 10, while arrow 11 indicates the refilling of silicon in the form of granules 12 into melting pot 2.

Figure 2:
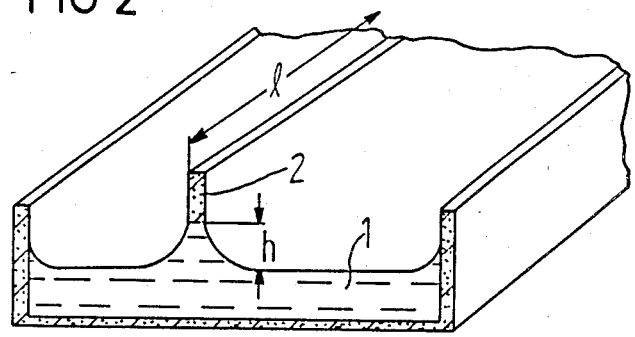
FIGS. 2 and 3 are diagrams which depict the wettability characteristics which apply to different materials.

With reference to FIG. 2, wherein the same components as in FIG. 1 are identified using the same reference numerals it may be seen that the distance between the graphite floor and the quartz basin is based on the realization that liquid silicon 1 can be raised by not more than height h by the edge-shaped body of length l wetted by silicon (in this case graphite edge of melting pot 2).

$$m \times g = \sigma \times 2 \times l (\sigma = \text{surface tension})$$

and substitution according to $\rho = m/V$ and $V \approx 2h^2/2 \times 1$ to $$h \approx \sqrt{\frac{2\sigma}{\delta \cdot \rho}} = 7.6 \text{ mm}$$

Figure 3:
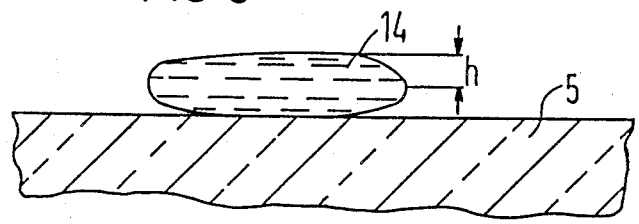

FIG. 3 is used for showing that: The same value is computed for the height of the crest above the plane's widest horizontal expansion of a drop 14, which is placed on a level non-wetting surface of the graphite net 5. Stable silicon smelting configuration in the area between the graphite melting pot floor (2) and the quartz basin (7) can be achieved with a value $h \leq 7.6$ mm, whereby, analogous to FIG. 3, h is to be measured at the smelt located in the basin without the graphite melting pot. The width of basin area a will be dimensioned in a manner which allows the graphite net 5 to be wetted and filled with smelt 1 while net 5 is being moved in the direction 6. Based on experience, a distance of 1.0 to 5.0 cm will suffice, if the speed of the extraction procedure approximates 10 cm/min. With a suitably shaped quartz basin 7, the total smelt volume can fluctuate by as much as 30 to 50%, without adversely affecting the wetting of the graphite net 5. This tolerance range will be applied to regulate the required refill procedures.

The refill arrangement for silicon 12 indicated by arrow 11 into the graphite melting pot 2 (refer to FIG. 1) can be performed using silicon in the form of granules, powder or drops. This refill arrangement is regulated by measuring the quantity of the "reserve volume", that is to say, the amount of smelt volume by which the filling in the quartz basin can be changed without changing the wetting procedure of the graphite net 5. For measuring purposes two pyrometers could be used which indicate the minimum and maximum filling of the reserve volume. These can be electrically connected with the refill configuration (not shown in FIG. 1).

Figure 4:
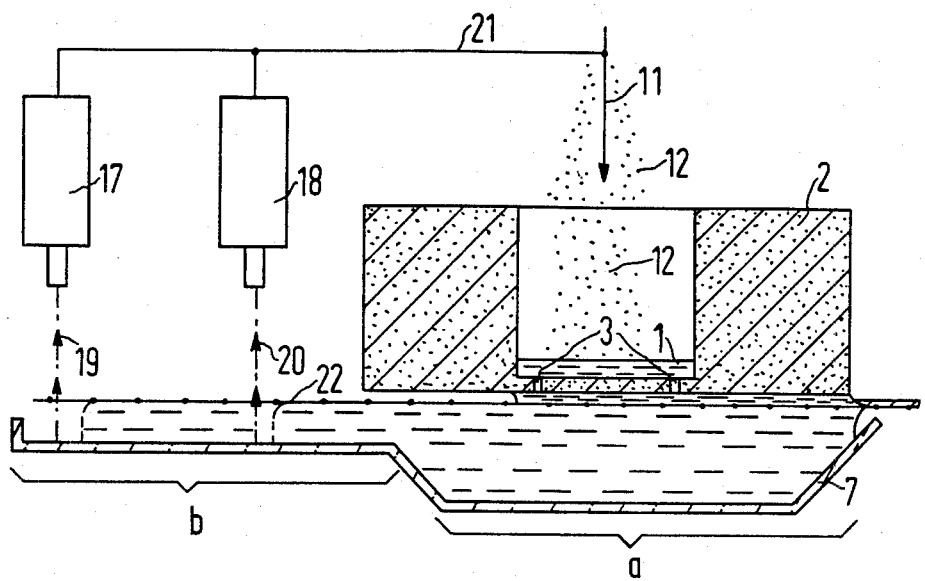
FIG. 4 illustrates apparatus in accordance with FIG. 1 with the addition of an arrangement for controlling the refilling of silicon.

FIG. 4 depicts apparatus of FIG. 1 including an arrangement for refilling of silicon (12) into smelt 1. The difference in the smelt level of the reserve volume in area b of basin 7 is measured by means of two pyrometers 17 and 18 which indicate the minimum (arrows 19) and the maximum filling (arrows 20) of the reserve volume. The outputs of pyrometers 17 and 18 are electrically coupled to the refill configuration via line 21. The maximum smelt level is indicated by point 22. As previously mentioned the graphic net is moved continuously and the refilling arrangement of FIG. 4 will therefore also operate in a continuous mode to maintain the smelt level.

There has thus been shown and described a novel apparatus for producing silicon for solar cells which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. Apparatus for manufacturing large-surfaced, band-shaped silicon bodies for solar cells including a carrier unit having a netlike structure of graphite material which, although resistant to silicon smelt can be wetted by said smelt and is continuously layered by said smelt, said apparatus comprising:
    (a) a melting pot for receiving said silicon smelt, said smelting pot being provided in its floor with vertical, and outwardly extending drain openings for feeding said smelt to the carrier unit, the floor of said melting pot is comprised of a material easily wettable by said silicon smelt;
    (b) a receptacle for holding said smelt comprising a material which cannot be wetted by said silicon smelt, the receptacle containing two areas "a" and "b" of different depths, wherein the distance from its bottom to the melting pot floor of area "a" located in the vicinity of a portion of the carrier unit being layered is larger by at least a factor of two than the distance from its bottom to said melting pot floor of area "b" located in the vicinity of a portion of the carrier unit which is non-layered;
    (a) a heatable canal being defined by the bottom of said melting pot and the upper surface of said smelt to be held in said receptacle, said heatable canal extending horizontally therebetween so as to guide and move the carrier unit located therein for layering with said melt.

2. Apparatus according to claim 1, wherein said melting pot is comprised of, at least in its floor, graphite and wherein said receptacle is comprised of quartz.

3. Apparatus according to claim 2, wherein the area "a" has a length that is essentially equal to 6 cm; and wherein the area "b" has a length that is essentially 3 cm.

4. Apparatus according to claim 3, further comprising means for providing a continuous refilling of silicon into said melting pot.

5. Apparatus according to claim 4, wherein said means for providing a continuous refilling are controlled to vary the amount of refilling by measuring a minimal and maximal filling requirement in said basin area "b"; said refill means comprising two pyrometers, which are positioned and arranged so as to determine said minimal and maximal filling requirement.

6. Apparatus according to claim 2, further comprising means for providing a continuous refilling of silicon into said melting pot.

7. Apparatus according to claim 6, wherein said means for providing a continuous refilling are controlled to vary the amount of refilling by measuring a minimal and maximal filling requirement in said basin area "b"; said refill means comprising two pyrometers, which are positioned and arranged so as to determine said minimal and maximal filling requirement.

8. Apparatus according to claim 1, wherein the area "a" has a length that is essentially equal to 6 cm; and wherein the area "b" has a length that is essentially 3 cm.

9. Apparatus according to claim 8, further comprising means for providing a continuous refilling of silicon into said melting pot.

10. Apparatus according to claim 9, wherein said means for providing a continuous refilling are controlled to vary the amount of refilling by measuring a minimal and maximal filling requirement in said basin area "b"; said refill means comprising two pyrometers, which are positioned and arranged so as to determine said minimal and maximal filling requirement.

11. Apparatus according to claim 1, further comprising means for providing a continuous refilling of silicon into said melting pot.

12. Apparatus according to claim 11, wherein said means for providing a continuous refilling are controlled to vary the amount of refilling by measuring a minimal and maximal filling requirement in said basin area "b"; said refill means comprising two pyrometers, which are positioned and arranged so as to determine said minimal and maximal filling requirement.

* * * * *